US011349259B2

(12) United States Patent
Liu et al.

(10) Patent No.: US 11,349,259 B2
(45) Date of Patent: May 31, 2022

(54) ELECTRICAL CONNECTOR

(71) Applicants: FU DING PRECISION INDUSTRIAL (ZHENGZHOU) CO., LTD., Zhengzhou (CN); FOXCONN INTERCONNECT TECHNOLOGY LIMITED, Grand Cayman (KY)

(72) Inventors: Meng Liu, Kunshan (CN); Shih-Wei Hsiao, New Taipei (TW); Yu-San Hsiao, New Taipei (TW); Yen-Chih Chang, New Taipei (TW); Yu-Ke Chen, Kunshan (CN); Jhih-Yao Jiang, New Taipei (TW)

(73) Assignees: FU DING PRECISION INDUSTRIAL (ZHENGZHOU) CO., LTD., Zhengzhou (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 17/137,394

(22) Filed: Dec. 30, 2020

(65) Prior Publication Data
US 2021/0203105 A1 Jul. 1, 2021

(30) Foreign Application Priority Data
Dec. 31, 2019 (CN) .......................... 201911414004.3

(51) Int. Cl.
*H01R 4/66* (2006.01)
*H01R 13/6471* (2011.01)
(Continued)

(52) U.S. Cl.
CPC ......... *H01R 13/6471* (2013.01); *H01R 12/55* (2013.01); *H01R 12/716* (2013.01);
(Continued)

(58) Field of Classification Search
CPC ............ H01R 13/6471; H01R 13/6461; H01R 13/514; H01R 13/6473; H01R 13/6587;
(Continued)

(56) References Cited
U.S. PATENT DOCUMENTS 6,899,566 B2   5/2005   Kline et al.
6,988,902 B2   1/2006   Winings et al.
(Continued)

FOREIGN PATENT DOCUMENTS

CN   202034538   11/2011
CN   202454772   9/2012
(Continued)

*Primary Examiner* — Khiem M Nguyen
(74) *Attorney, Agent, or Firm* — Ming Chieh Chang; Wei Te Chung

(57) ABSTRACT

An electrical connector includes: an insulating housing; and plural terminals held in the insulating housing and arranged in terminal pairs, each of the terminals including: a holding portion held in the insulating housing; a cantilever extending forward from the holding portion, a slot being provided on the cantilever; a contact portion at a front of the cantilever; and a mounting portion for mounting on a circuit board; wherein the slot extends to the contact portion; and in each terminal pair, a first distance from a center of the contact portion of one terminal thereof to a center of the contact portion of the other terminal thereof is less than a second distance from a center of the mounting portion of one terminal thereof to a center of the mounting portion of the other terminal thereof.

19 Claims, 19 Drawing Sheets

(51) Int. Cl.
    *H01R 13/6473*      (2011.01)
    *H01R 13/6587*      (2011.01)
    *H01R 12/72*      (2011.01)
    *H01R 12/55*      (2011.01)
    *H01R 13/514*      (2006.01)
    *H05K 1/14*      (2006.01)
    *H01R 12/71*      (2011.01)

(52) U.S. Cl.
    CPC .......... *H01R 12/724* (2013.01); *H01R 13/514* (2013.01); *H01R 13/6473* (2013.01); *H01R 13/6587* (2013.01); *H05K 1/14* (2013.01); *H05K 2201/044* (2013.01); *H05K 2201/10189* (2013.01)

(58) Field of Classification Search
    CPC .... H01R 12/55; H01R 12/716; H01R 12/724; H05K 1/14; H05K 2201/044; H05K 2201/10189
    USPC .................................................... 439/92, 108
    See application file for complete search history.

(56) References Cited

U.S. PATENT DOCUMENTS

| | | |
|---|---|---|
| 7,785,148 B2 | 8/2010 | Pan |
| 8,202,118 B2 | 6/2012 | Cohen et al. |
| 8,465,302 B2 | 6/2013 | Regnier et al. |
| 8,715,005 B2 | 5/2014 | Pan |
| 8,905,786 B2 | 12/2014 | Davis et al. |
| 8,920,195 B2 | 12/2014 | Cohen et al. |
| 8,961,227 B2 | 2/2015 | Gailus et al. |
| 8,961,229 B2 | 2/2015 | Pan |
| 9,077,094 B2 | 7/2015 | Minich |
| 9,356,401 B1 | 5/2016 | Horning et al. |
| 9,407,045 B2 | 8/2016 | Horning et al. |
| 9,748,698 B1 | 8/2017 | Morgan et al. |
| 9,831,588 B2 | 11/2017 | Cohen |
| 10,038,282 B2 | 7/2018 | De Geest et al. |
| 10,170,869 B2 | 1/2019 | Gailus et al. |
| 10,205,286 B2 | 2/2019 | Provencher et al. |
| 10,355,416 B1 | 7/2019 | Pickel et al. |
| 10,644,453 B2 | 5/2020 | Laurx et al. |
| 10,686,282 B1 | 6/2020 | McCarthy et al. |
| 10,707,626 B2 | 7/2020 | Cartier, Jr. et al. |
| 2021/0203105 A1* | 7/2021 | Liu ...................... H01R 12/724 |

FOREIGN PATENT DOCUMENTS

| | | |
|---|---|---|
| CN | 204668627 | 9/2015 |
| CN | 102904119 | 6/2016 |
| CN | 104167620 | 8/2017 |
| CN | 104718666 | 8/2018 |
| CN | 109494499 | 3/2019 |
| CN | 105470736 | 8/2019 |

* cited by examiner

ELECTRICAL CONNECTOR

BACKGROUND OF THE INVENTION

1. Field of the Invention

The present invention relates generally to an electric connector assembly with an electric connector, and more particularly to a high-speed backplane electrical connector used in the communication field.

2. Description of Related Arts

U.S. Pat. No. 6,988,902 discloses an electrical connector assembly with a plug electrical connector and receptacle electrical connector matched with the plug electrical connector. Both the plug electrical connector and receptacle electrical connector include plural rows of terminals. The terminals of each row include a differential signal pair and a ground terminal arranged between adjacent differential signal pairs. Each differential signal pair in each column is staggered from the corresponding differential signal pair in the adjacent column. There is no metal shield between adjacent rows. Although the staggering of the differential pairs can reduce crosstalk to a certain extent, can realize the transmission of lower differential signals of 6 Gbps and below, however, with the increase in the transmission speed of differential signals, the transmission speed of many differential signals has reached 25 Gbps or even 56 Gbps at present. Therefore, it is difficult to meet high transmission rate by simply relying on this staggered arrangement. Therefore, an improved electrical connector assembly is needed.

An improved electrical connector assembly with an electrical connector that can transmit differential signal transmission at 56 Gbps or higher is desired.

SUMMARY OF THE INVENTION

A main object of the present invention is to provide an electrical connector with high transmission speed and simple and reliable structure.

To achieve the above-mentioned object, an electrical connector comprises: an insulating housing; and a plurality of terminals held in the insulating housing and arranged in terminal pairs, each of the terminals including: a holding portion held in the insulating housing; a cantilever extending forward from the holding portion, a slot being provided on the cantilever; a contact portion at a front of the cantilever; and a mounting portion for mounting on a circuit board; wherein the slot extends to the contact portion; and in each terminal pair a first distance from a center of the contact portion of one terminal thereof to a center of the contact portion of the other terminal thereof is less than a second distance from a center of the mounting portion of one terminal thereof to a center of the mounting portion of the other terminal thereof.

To achieve the above-mentioned object, an electrical connector comprises: a plurality of terminal modules stacked laterally, each of the terminal modules including an insulating body, a plurality of ground terminals held in the insulating housing, and a plurality of signal terminals held in the insulating body and arranged in pairs, both sides of each signal terminal pair being disposed ground terminals in a longitudinal direction, wherein the signal terminals are arranged in a first plane, and the ground terminals are arranged in a second plane different from the first plane, the ground terminals on both sides of the signal terminal pair are mechanically and electrically connected to each other.

To achieve the above-mentioned object, an electrical connector comprises a plurality of terminal modules stacked laterally, each of the terminal modules including: an insulating body; a plurality of ground terminals held in the insulating body, each of the ground terminal including a wide side and a narrow side, each ground terminal including a grounding mating end for mating with a mating connector, a grounding mounting end, and a transition portion between the grounding mounting end and the grounding mating end; and a plurality of signal terminals held in the insulating body and arranged in pairs, ground terminals are provided on both sides of each signal terminal pair in the longitudinal direction, each signal terminal including a wide side and a narrow side, each of the signal terminals including a mating end for mating with the mating connector, a mounting end, and a middle portion between the mounting end and the mating end; wherein the middle portion and the mating ends of the two signal terminals formed the signal terminal pair are narrow-side coupling, the intermediate portion of the signal terminal and the transition portion of the ground terminal shielding it are narrow-side coupling, the mating end of the signal terminal and the grounding mating end of the ground terminal are narrow-side to broad-side coupling.

Compared to the prior art, in the electrical connector assembly of the present invention, through change of the distance between the terminal pair and design of the opening on the terminal, the ground terminals on both sides of the signal terminal pair mechanically and electrically are connected. or the signal terminal pair and the ground terminals on both sides are coupled in different directions to reduce crosstalk between adjacent signal terminal pairs, thereby improving the shielding effect of the electrical connector assembly and providing better conditions for stable transmission of high-frequency signals.

DETAILED DESCRIPTION OF THE PREFERRED EMBODIMENT

Figure 1:
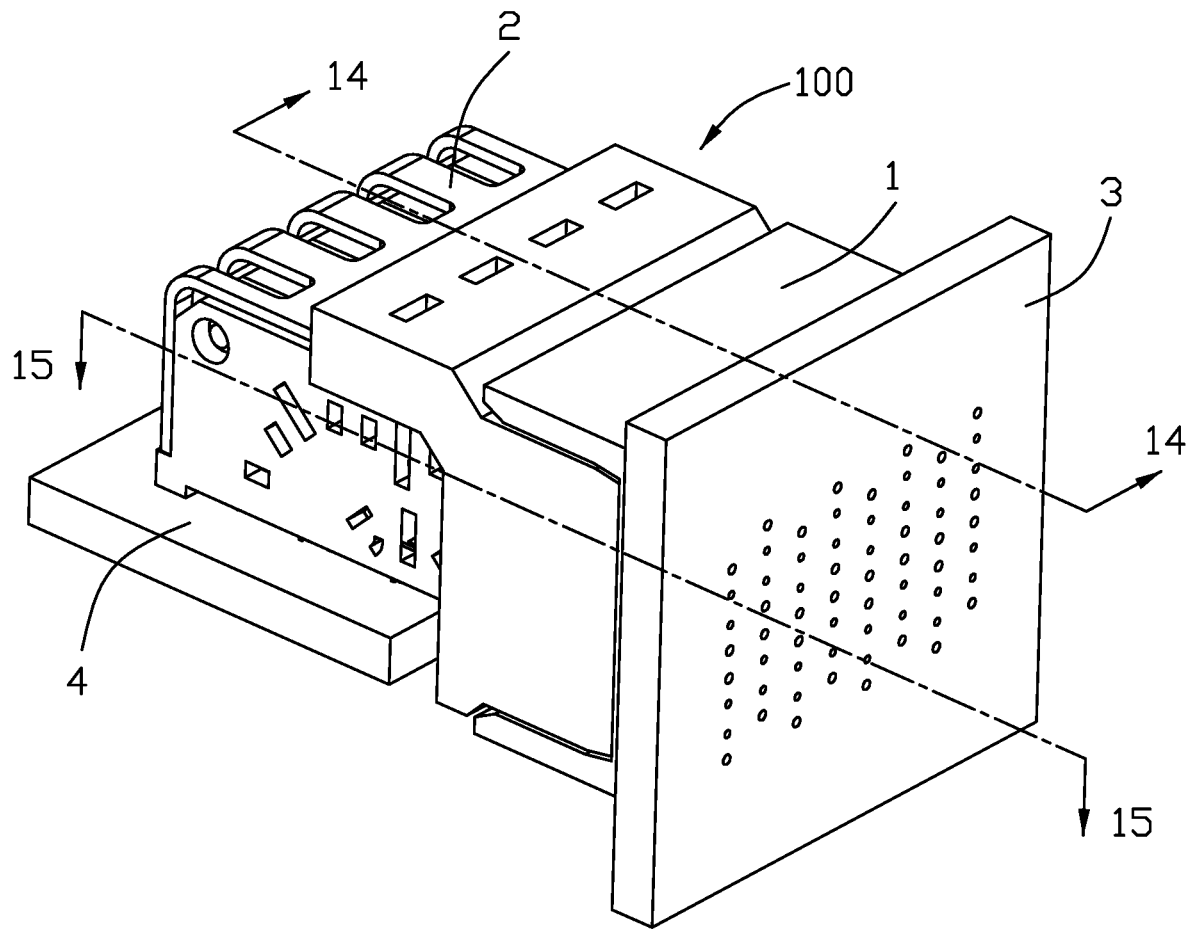
FIG. 1 is a perspective view of an electrical connector assembly including a first electrical connector and a second electrical connector in accordance with the present invention.
Figure 2:
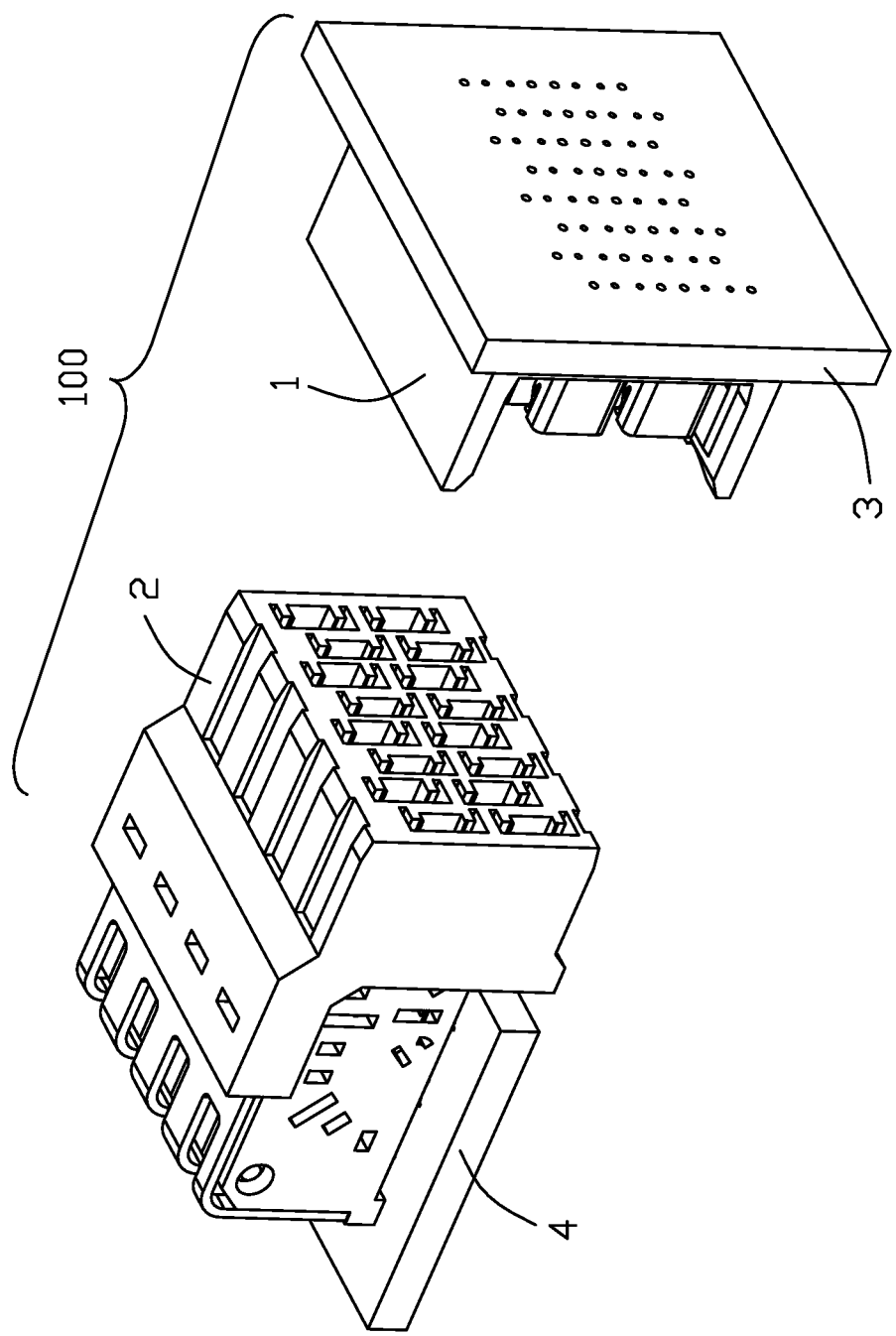
FIG. 2 is a perspective view of the electrical connector assembly before mating in FIG. 1.
Figure 3:
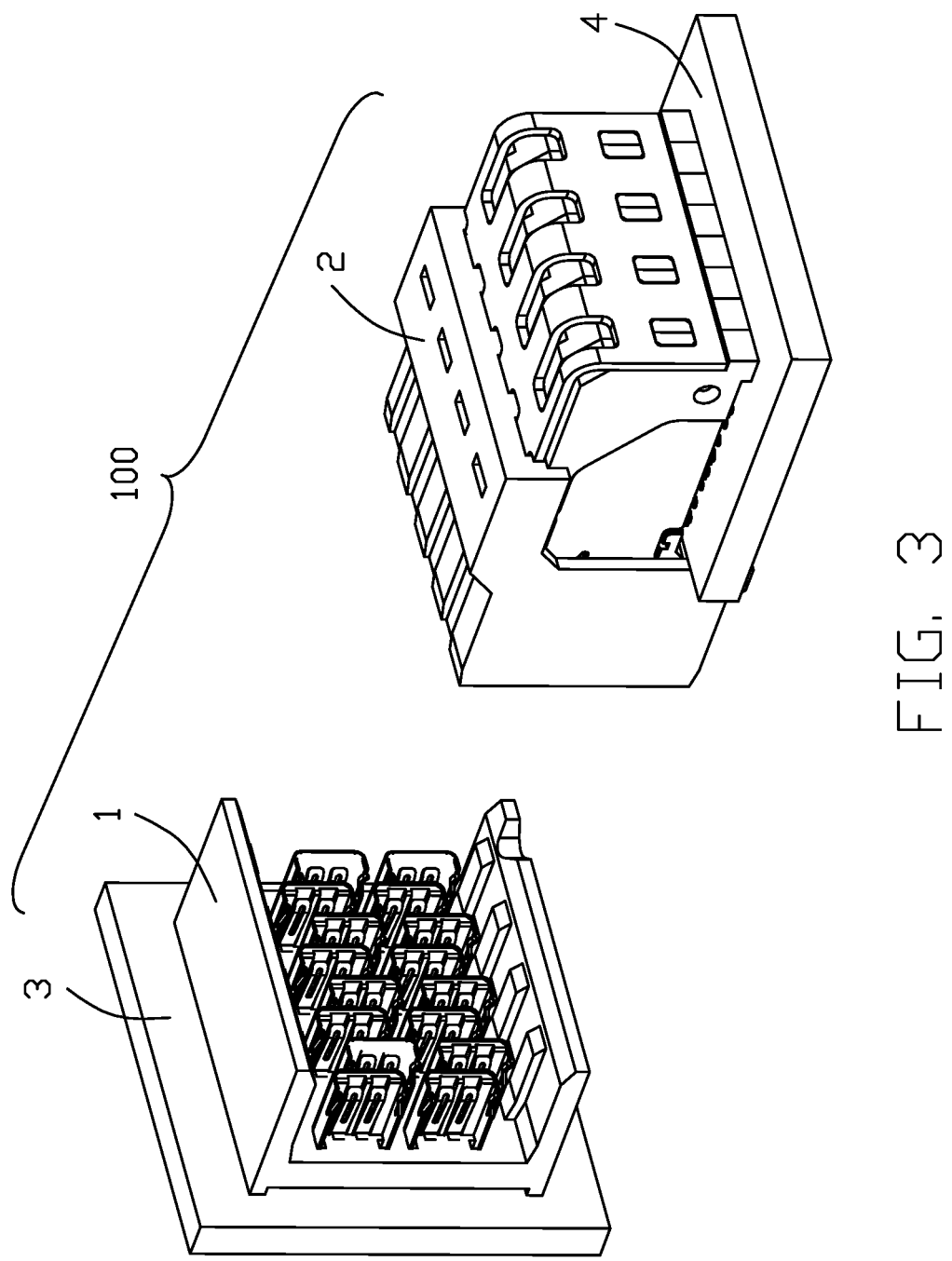
FIG. 3 is another perspective view of the electrical connector assembly in FIG. 2.
Figure 4:
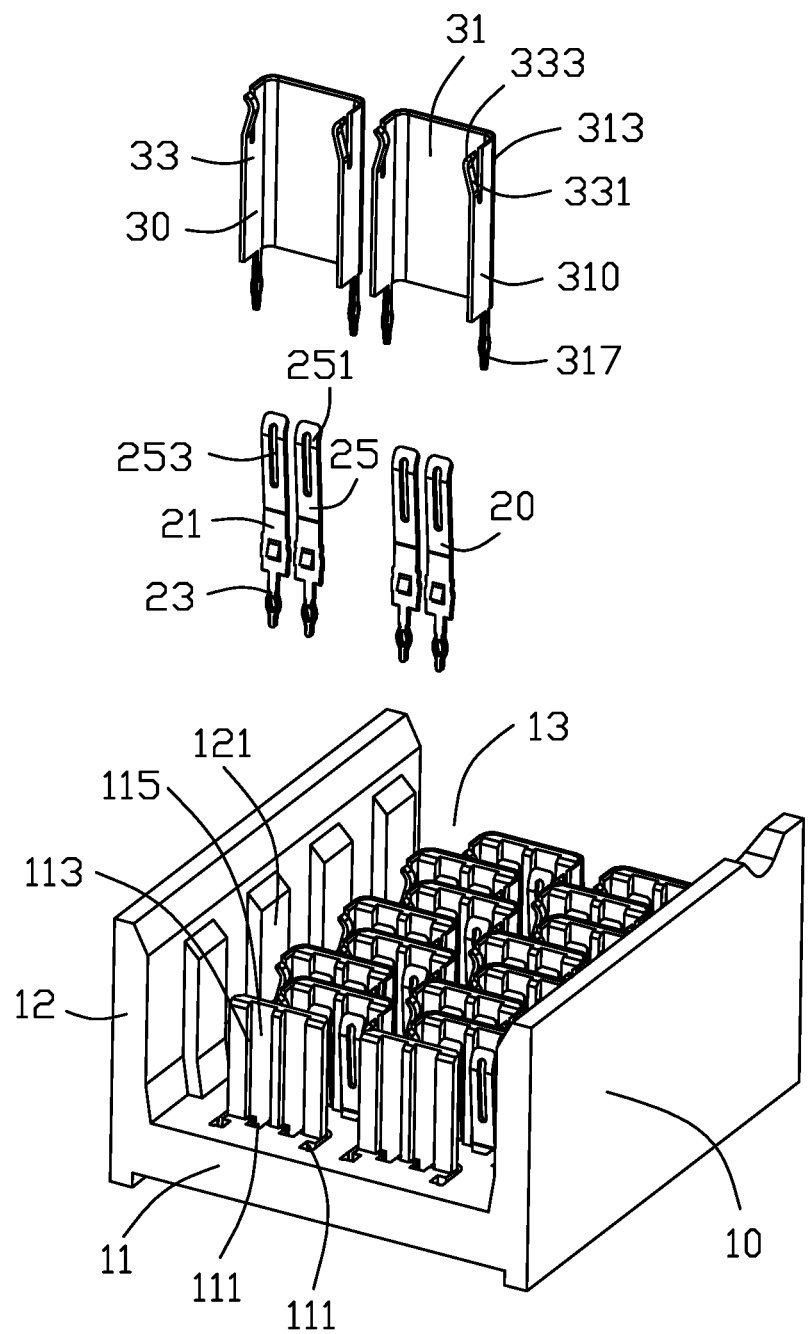
FIG. 4 is a partial exploded view of the first electrical connector in FIG. 2.
Figure 5:
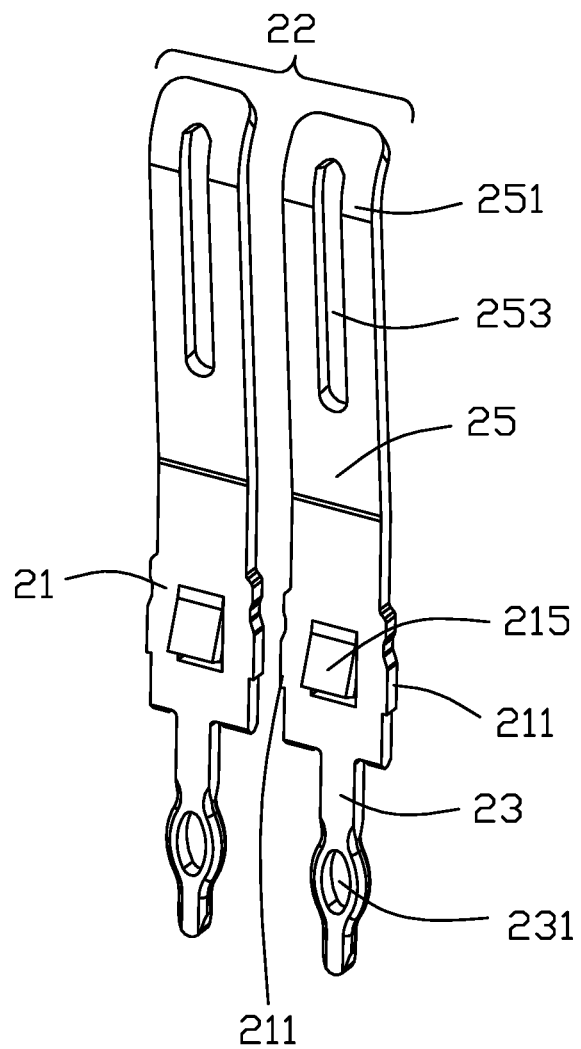
FIG. 5 is a perspective view of a terminal pair of the first electrical connector in FIG. 4.
Figure 6:
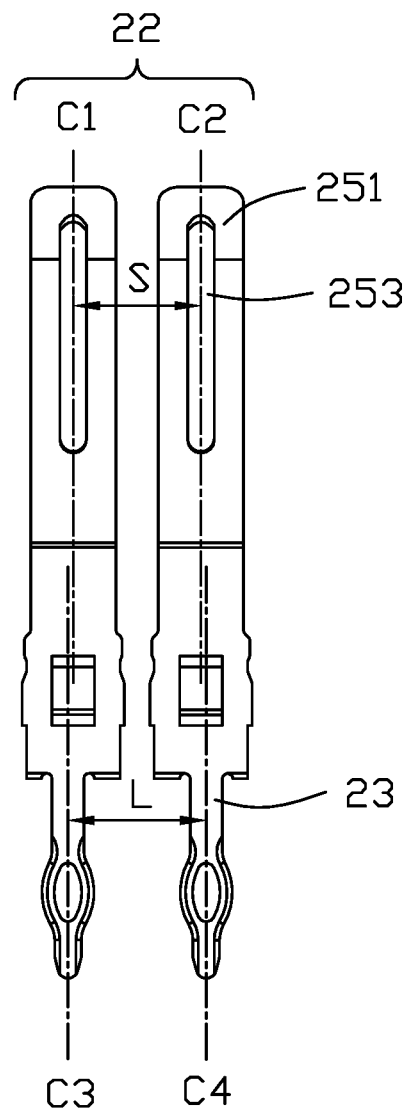
FIG. 6 is a front view of terminal pair in FIG. 5.
Figure 7:
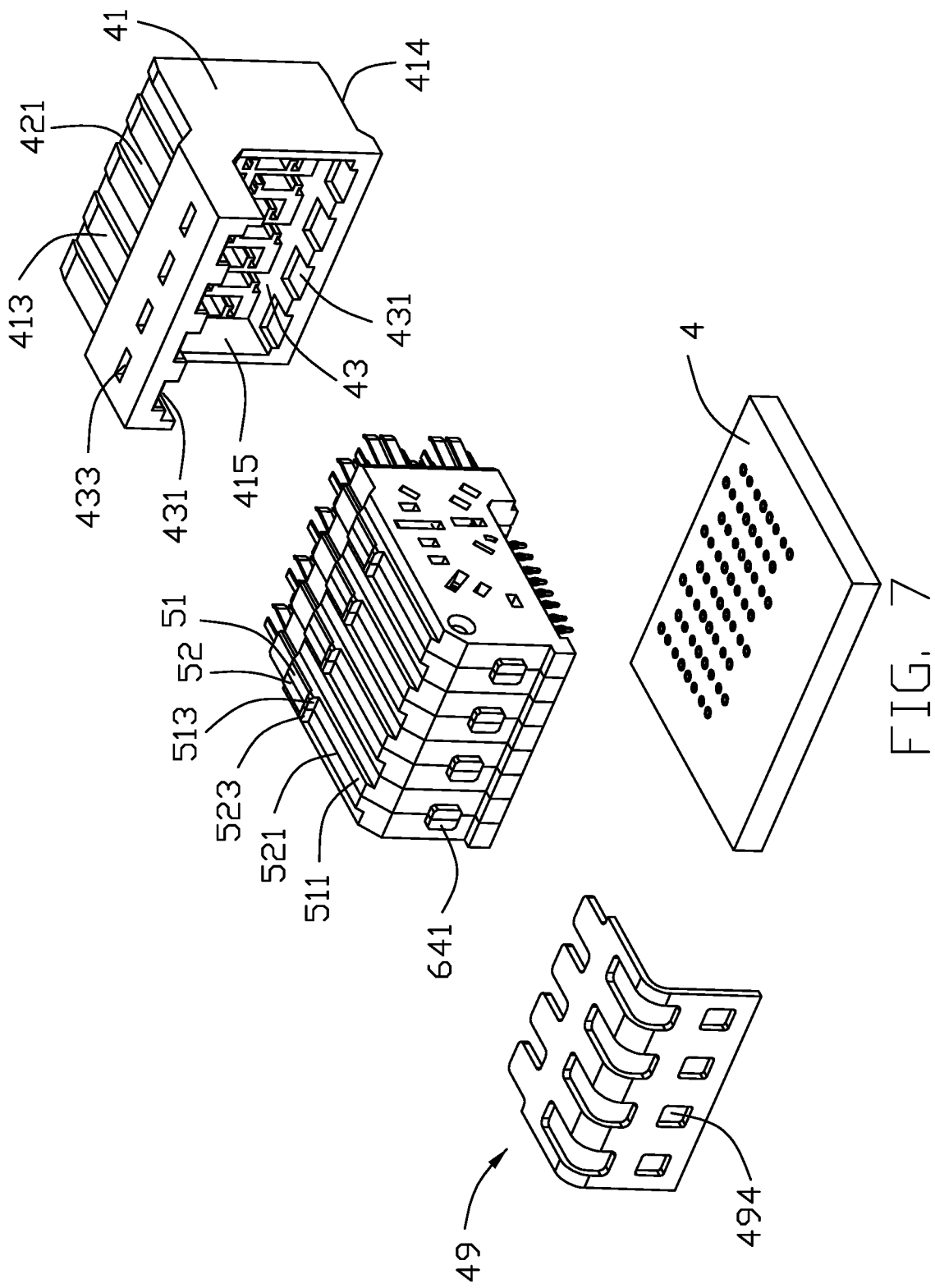
FIG. 7 is a partial exploded view of the second electrical connector in FIG. 2.
Figure 8:
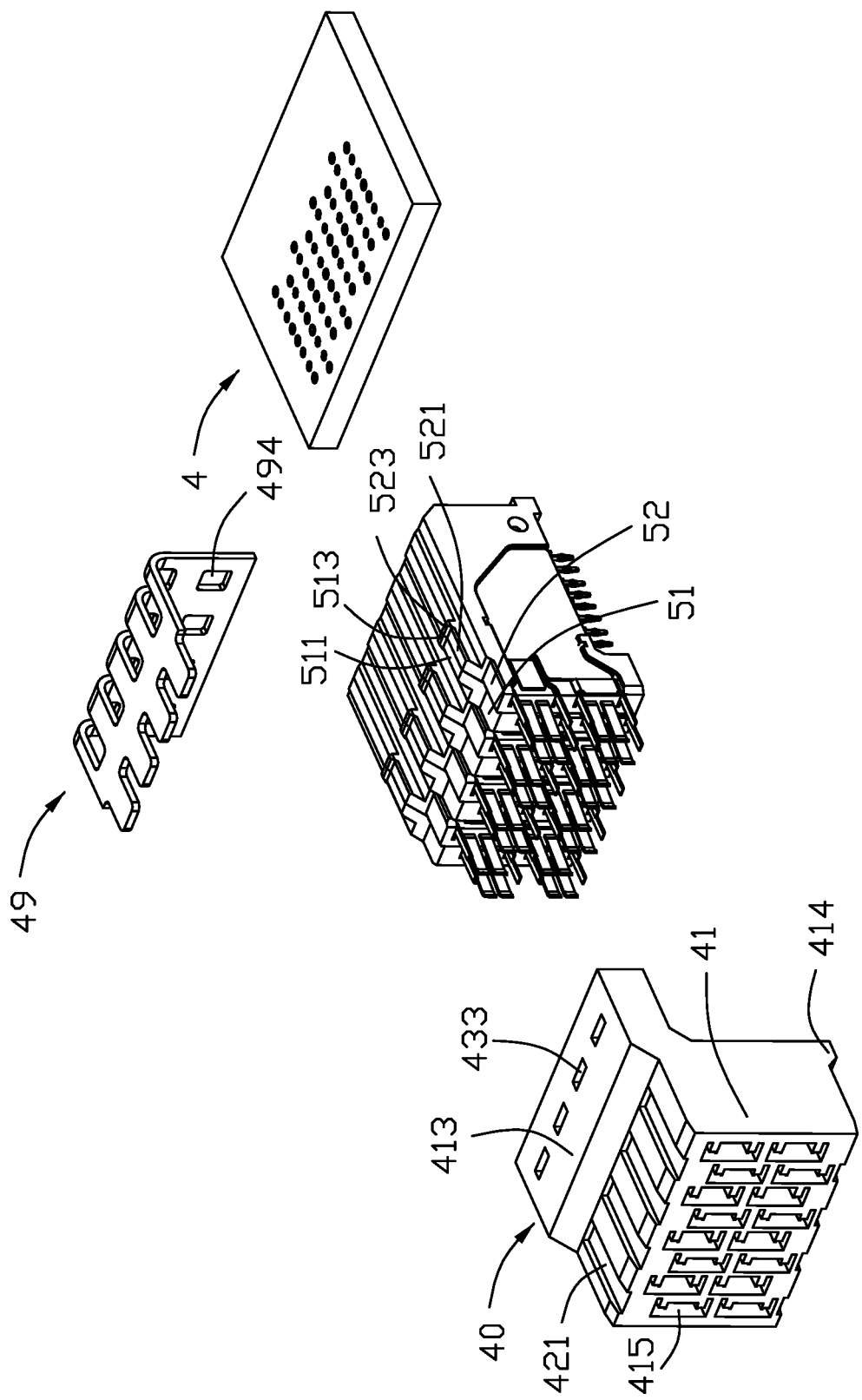
FIG. 8 is another exploded view of the second electrical connector in FIG. 7.
Figure 9:
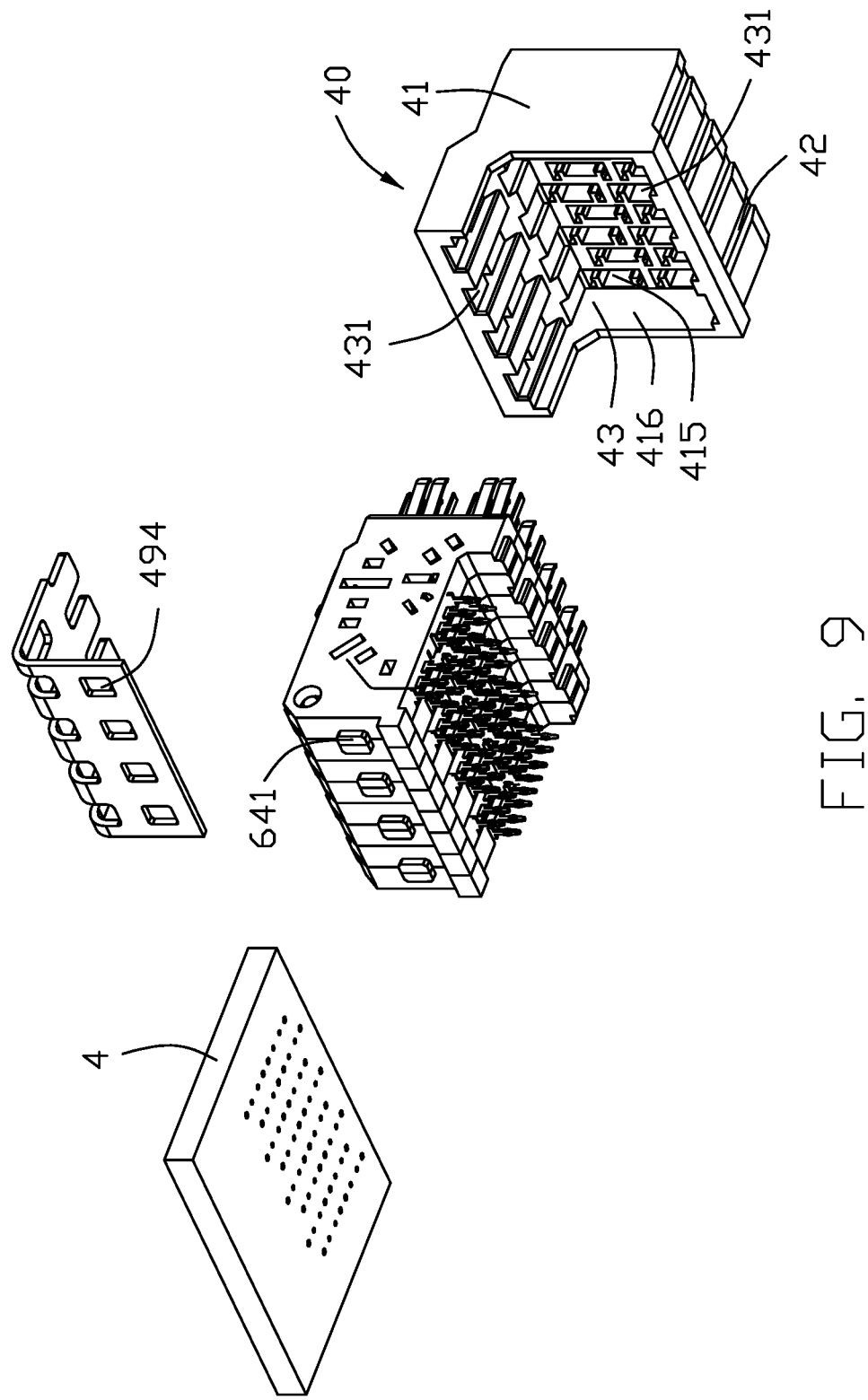
FIG. 9 is another exploded view of the second electrical connector in FIG. 8.
Figure 10:
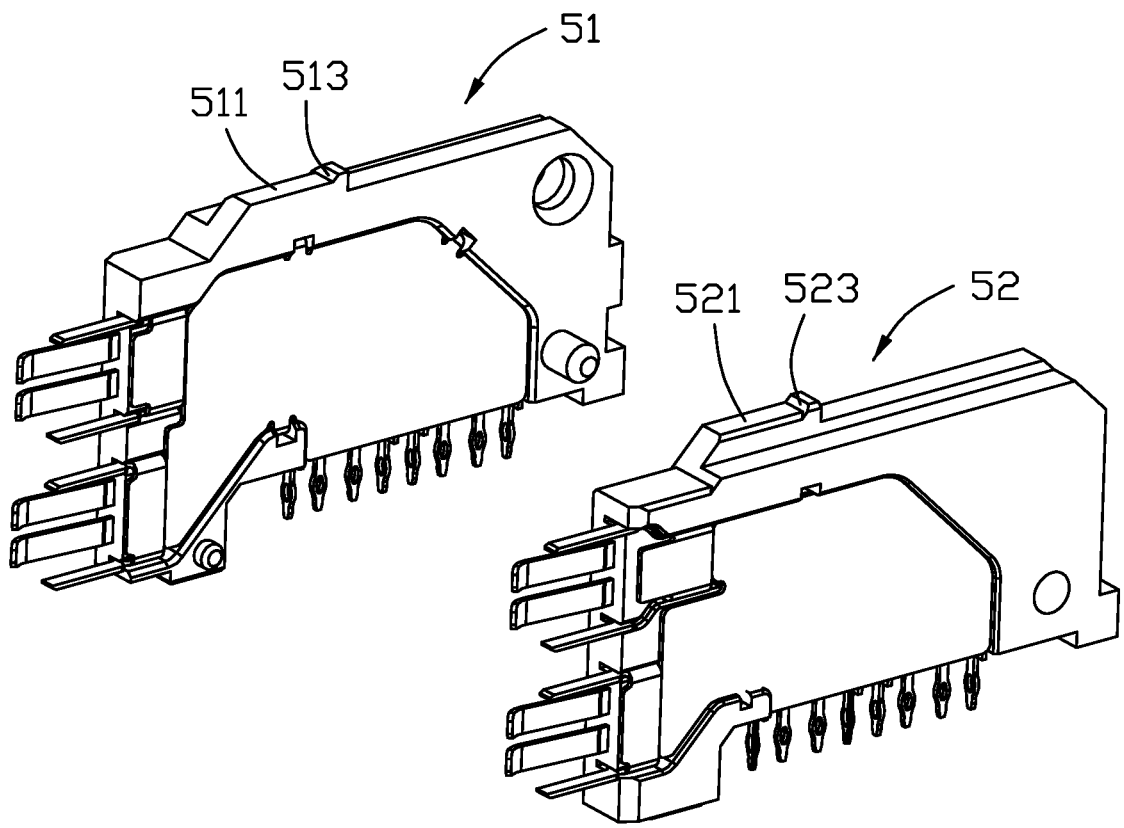
FIG. 10 is a partial exploded view of the first terminal module and the second terminal module of the second electrical connector.
Figure 11:
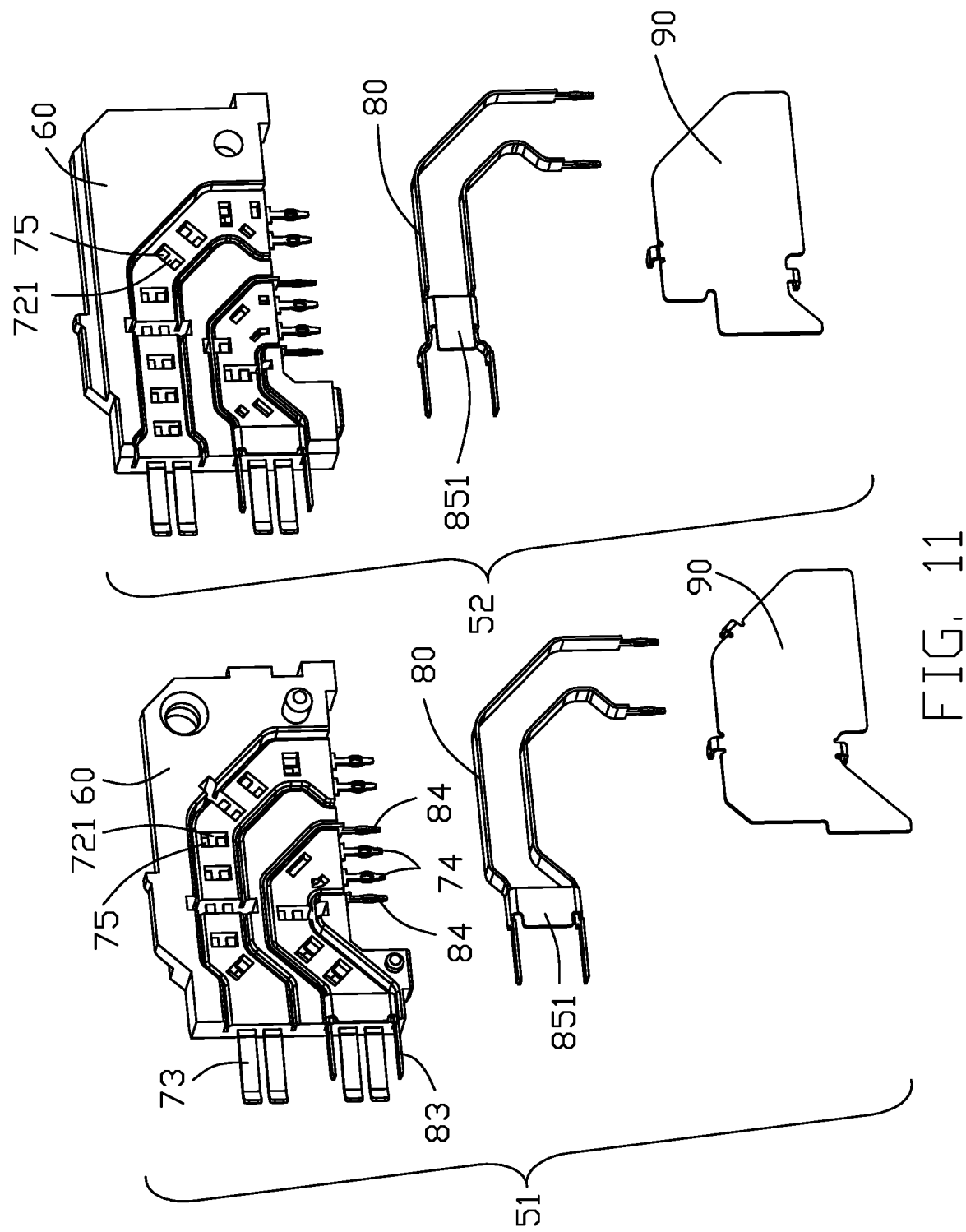
FIG. 11 is a further exploded view of the terminal module r in FIG. 10.
Figure 12:
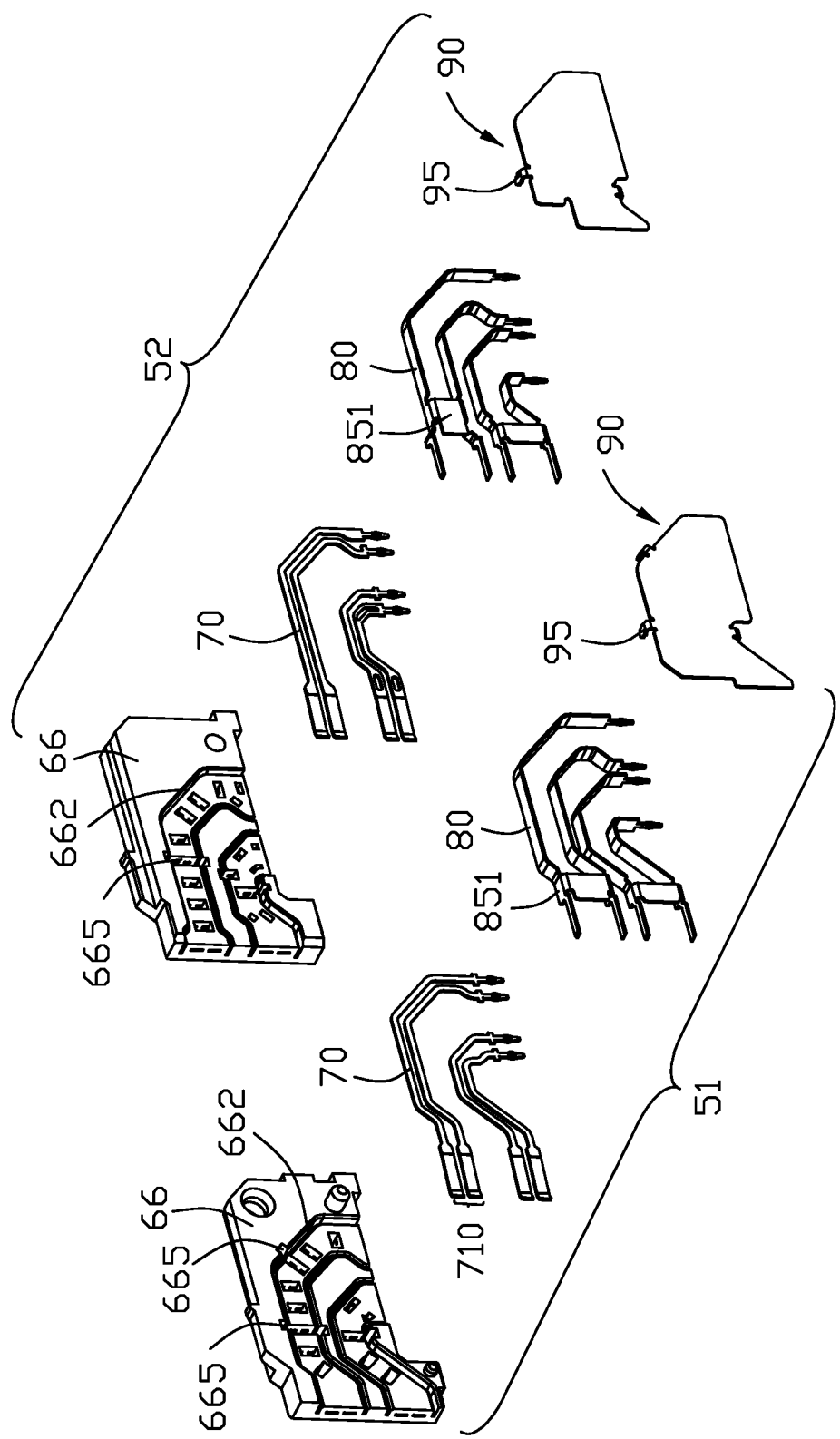
FIG. 12 is a further exploded view of the terminal module r in FIG. 11.
Figure 13:
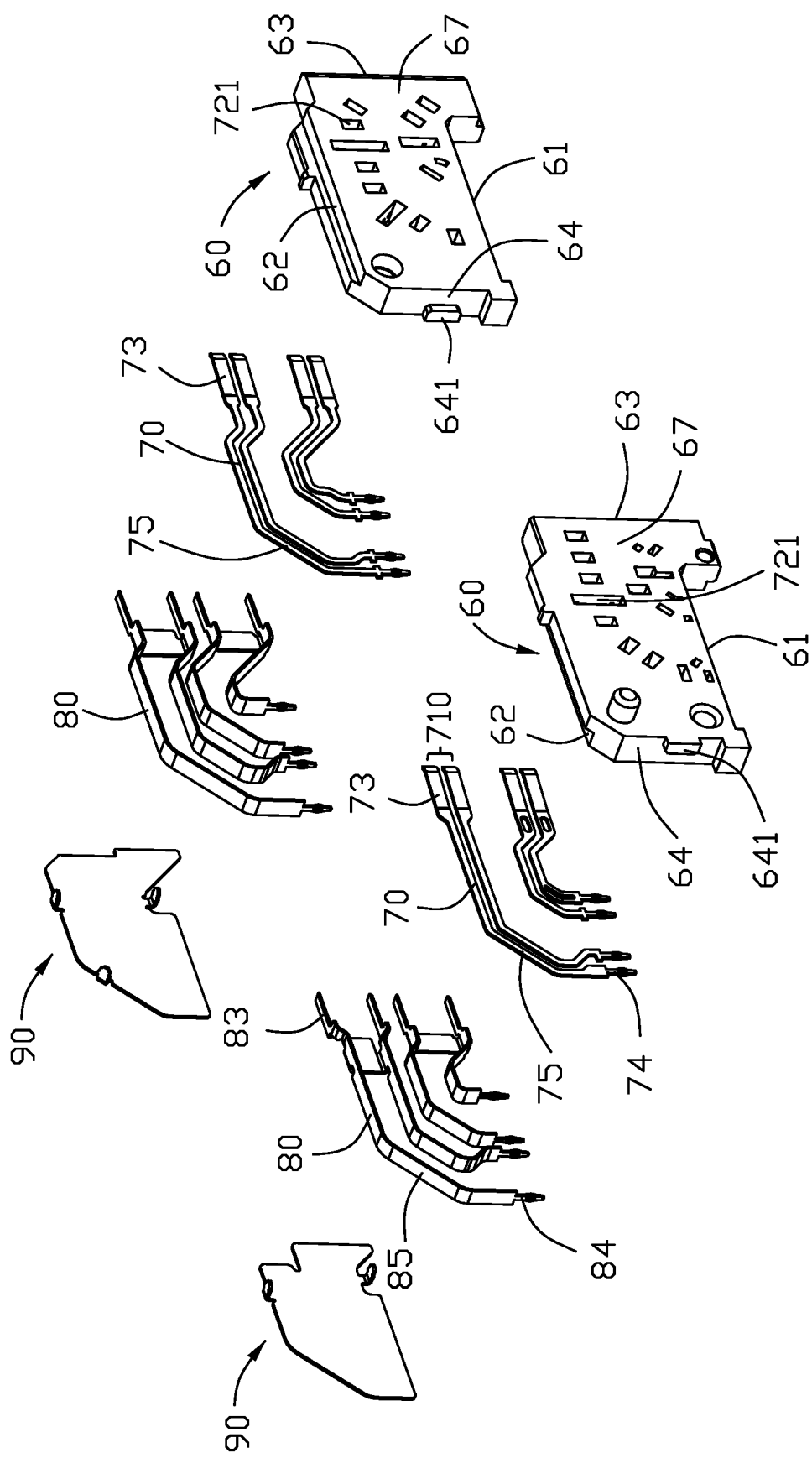
FIG. 13 is another further exploded view of the terminal module in FIG. 12.
Figure 14:
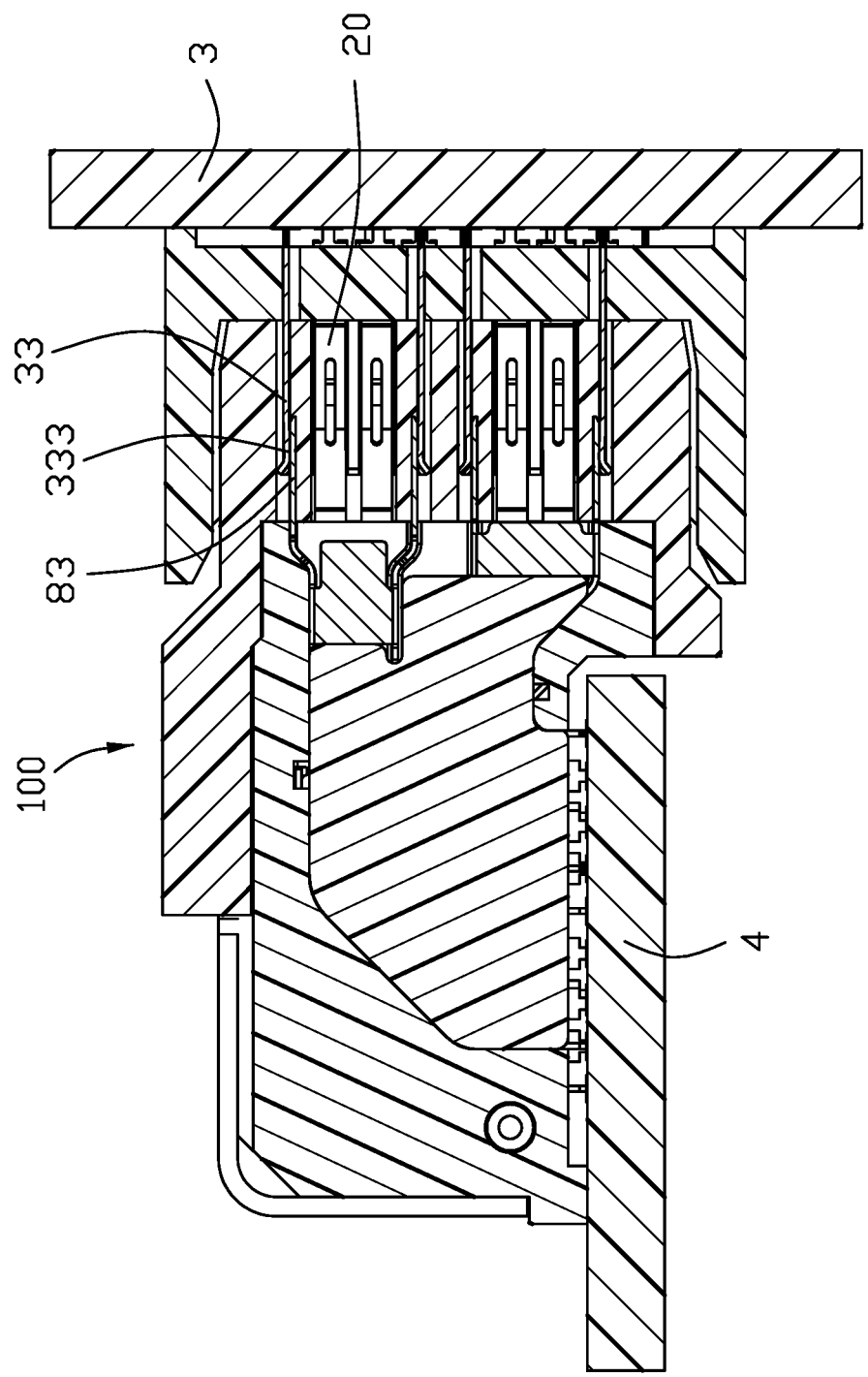
FIG. 14 is a cross-sectional view along line 14-14 of the electrical connector assembly in FIG. 1.
Figure 15:
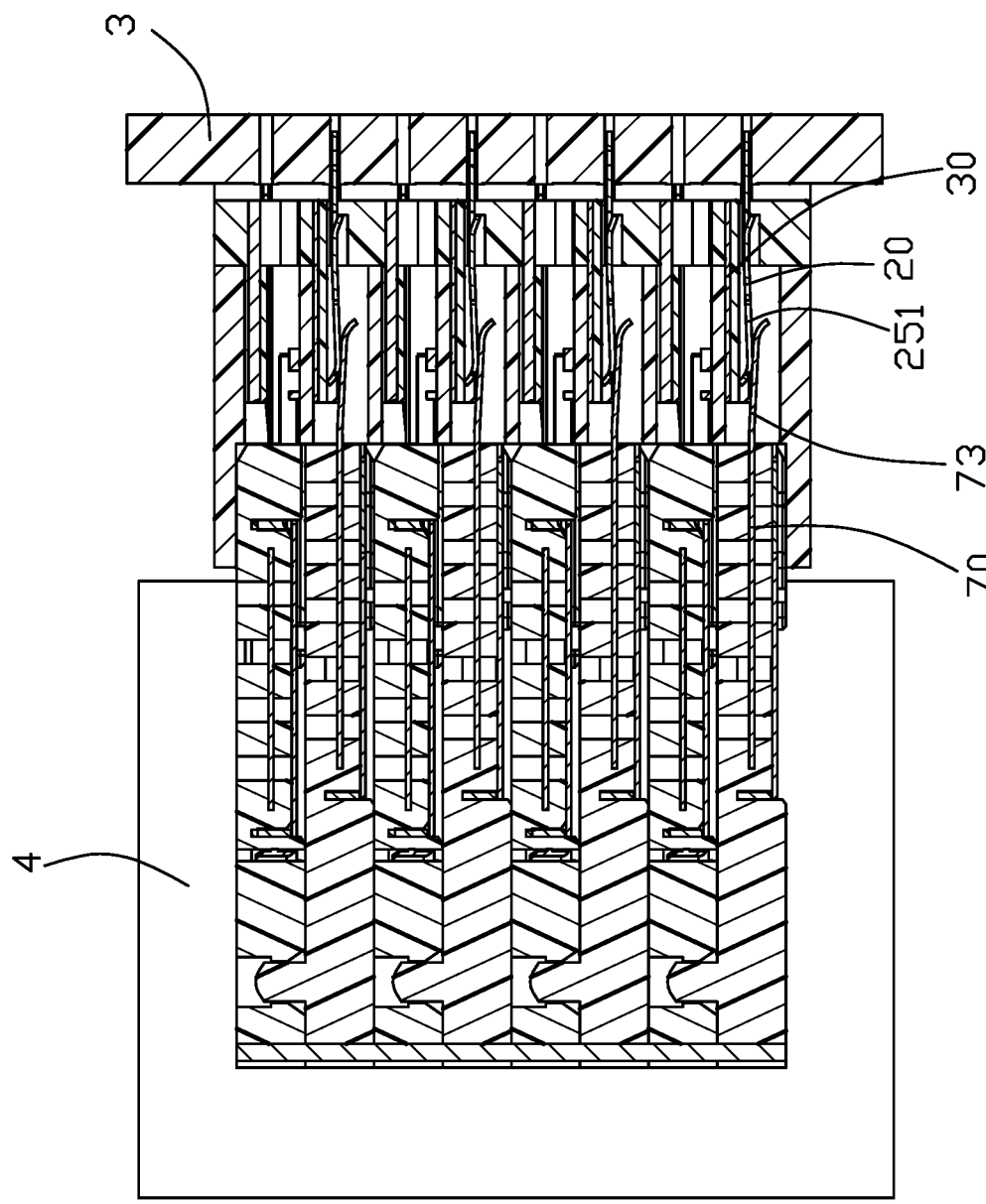
FIG. 15 is a cross-sectional view along line 15-15 of the electrical connector assembly in FIG. 1.

Referring to FIGS. 1-15, the electrical connector assembly 100 of the present invention includes a first electrical connector 1 and a second electrical connector 2 that cooperates with the first electrical connector 1. The first electrical connector 1 is mounted on the first circuit board 3, and the second electrical connector 2 is mounted on the second circuit board 4. After the first electrical connector 1 and the second electrical connector 2 are mated, the transmission speed per channel can reach 112 Gbps, or even higher.

The first electrical connector 1 includes an insulating housing 10, a plurality of terminals 20 fixed on the insulating housing 10, and a shielding sheet 30 fixed on the insulating housing 10 to shield the terminals.

The insulating housing 10 includes a bottom wall 11 and a pair of side walls 12 spaced apart from each other extending from the same side of the bottom wall 11. The bottom wall 11 and the two side walls 12 jointly enclose a receiving space 13. The bottom wall 11 includes a plurality of mounting holes 111 arranged in rows and columns and penetrating the bottom wall 11 for mounting the terminals 20 and the shielding sheet 30. The bottom wall 11 is provided with a plurality of supporting walls 113 protruding toward the receiving space 13 for supporting the terminal 20, and each supporting wall 113 includes two grooves 115. The side wall 12 is provided with a guide bar 121 for guiding the second electrical connector 2 to be accurately inserted into the receiving space 13. Each of the terminals 20 includes a holding portion 21 for holding on the bottom wall 11, a mounting portion 23 extending downward from the holding portion 21 for mounting on the first circuit board 3, a cantilever 25 extending upward from the holding portion 21 into the receiving space 13 and a contact portion 251 located at the front of the cantilever 25. The cantilever 25 is provided with a slot 253, and the slot 253 extends to the contact portion 251. The periphery of the slot 253 is completely enclosed in the terminal 20. The cantilever 25 is received in the grooves 115. By providing a slot extending to the contact portion on the terminal 20, the contact area of the terminal is reduced, thereby reducing the capacitance effect, thereby improving the impedance matching on the entire transmission path, and improving the shielding effect of the electrical connector. The terminals 20 are formed by punching from a flat plate metal material and then bending, each of the terminals 20 includes a wide side on the surface of a flat metal plate and a narrow side cut from the flat plate material. There are barbs 211 protruding outwardly on the narrow sides of both sides of the holding portion 21, The wide side is provided with wide barbs 215 protruding from the wide side. The wide barb 215 is torn out from the wide side. Each terminal 20 is fixed on the bottom wall 11 by a barb 211 and a wide barb 215. Two adjacent terminals 20 form a terminal pair 22 for transmitting a pair of differential signals. The two terminals 20 forming the terminal pair 22 are narrow-side coupled. The distance from the center of the contact portion 251 of one terminal 20 of the terminal pair 22 to the center of the contact portion 251 of the other terminal 20 is the first dimension, the distance from the center of the mounting portion 23 to the center of the mounting portion 23 of the other terminal 20 is the second dimension. The first dimension is smaller than the second dimension to reduce signal crosstalk between the terminal pair 22 and the adjacent terminal pair 22.

The shielding sheet 30 includes a main wall 31 and a pair of side walls 33 extending in the same direction from both sides of the main wall. The main wall 31 and the two side walls 33 surround one terminal pair 22 in three directions, and shield the terminal pair 22 from the other terminal pairs 22. The main wall 31 is parallel to the wide side of the terminal pair 22 that it shields, and the pair of side walls 33 respectively opposite to the corresponding narrow side of the terminal pair 22. The side of the shielding sheet 30 facing the terminal pair surrounded by it is defined as the inner side, and the side opposite to the inner side is defined as the outer side. Each side wall 33 includes one contact elastic 331, each of the contact elastic 331 includes a contact protrusion 333, the contact elastic 331 extends inward, and the contact protrusion 333 protrudes inward. The shielding sheet 30 includes a main body 310 mounted on the bottom wall 11, a first mounting portion 311 extending downward from the main body 310 for mounting on the first circuit board 3, and a first mating portion 313 extending upward from the main body 310 into the receiving space 13. The contact elastic 331 is integrally stamped from the first mating portion 313. The size of the first mating portion 313 extending into the receiving space 13 is larger than the size of the contact portion 251 of the terminal 20 extending into the receiving space 13. Each side wall 33 includes one ground pin 317.

The second electrical connector 2 includes a housing 40, a plurality of terminal modules 50 installed in the housing 40 and aligned laterally, and a holder 49 for fixing the terminal module 50. Each of the terminal modules 50 includes an insulating body 60, a plurality of signal terminals 70 fixed in the insulating body 60, a plurality of ground terminals 80 held in the insulating body 60, and a ground plate 90 located on one side of the terminal module 50.

The housing 40 includes a base 41 with a front mating surface 401, an upper wall 413 and a lower wall 414 extending rearward from the base 41, and a pair of connecting walls 416 connecting the upper and lower walls. The upper wall 413, the lower wall 414, and the pair of connecting walls 416 jointly form a receiving cavity 43. The front parts of a plurality of terminal modules 50 are received in the receiving cavity 43 from back to front. The outer surfaces of the upper wall 413 and the lower wall 414 are provided with positioning grooves 421. The positioning groove 421 is used to cooperate with the guide bar 121 on the first electrical connector 1. The inner side of the lower wall 414 and the upper wall 413 is provided with a plurality of guiding grooves 431 for guiding the terminal modules 50 to be aligned, wherein the guiding groove 431 on the upper wall 413 is provided with a hole 433 penetrating the upper wall. The base 41 includes a plurality of alignment holes 415 penetrating through the front mating surface 401 and the receiving cavity 43 for receiving the mating terminals 20 and shielding sheets 30 on the first electrical connector 1.

The insulating body 60 is sheet-shaped, it includes a lower edge 61 facing the installation direction, an upper edge 62 opposite to the lower edge 61, a front edge 63 facing the mating electrical connector, and a rear edge 64 opposite to the front edge 63. The rear edge 64 is provided with a clamping rib 641, and the holder 49 includes a clamping hole 494 for receiving the corresponding clamping rib 641. Therefore, the terminal modules 50 are fixed as a whole through the holder 49 and the housing 40. The insulating body 60 has a first side 66 and a second side 67 opposed to each other in the thickness direction thereof, and a plurality of installation grooves 662 are provided on the first side 66. The outer surface of the insulating body 60 is coated with a layer of absorbing material.

The signal terminal 70 is integrally formed with the insulating body 60, the signal terminal 70 is arranged in the form of a signal terminal pair 710, and each signal terminal pair 710 is used to transmit a pair of differential signals. Each of the signal terminals 70 includes a mating end 73 extending from the insulating body 60 in the mating direction. Each of the signal terminals 70 includes a mating end 73 extending along the mating direction, a mounting end 74 extending along the mounting direction and capable of being mounted on the second circuit board 4, and a middle part 75 between the mounting end 74 and the mating end 73. The mating end 73 is perpendicular to the mounting end 74. Each of the signal terminals 70 includes a wide side and a narrow side. The wide sides of the signal terminal pair 710 are arranged on the same plane, and the two signal terminals 70 constituting the signal terminal pair 710 are coupled with a narrow side. The insulating body 60 is provided with an air gap 721 for exposing the signal terminal 70 to air. The air gap 721 may be provided only on one side of the insulating body 60, or may be provided on both sides of the insulating body 60. Expose the signal terminal 70 to air, adjust the capacitance effect through the different dielectric constant of different materials to improve its characteristic impedance to meet 80-100 ohm. It can also be implanted in the opening with a material with a different dielectric constant from the insulating body 60 or by implanting an electrical component to adjust the capacitance effect.

The ground terminal 80 includes a ground mating end 83 that cooperates with the first electrical connector 1, a ground mounting end 84 mounted on the second circuit board, and a transition portion 85 between the ground mounting end 84 and the ground mating end 83. Each ground terminal 80 is installed in the corresponding installation grooves 662 on the insulating body 60. In the vertical direction, ground terminals 80 are provided on both sides of each of the differential signal terminal pairs 710. The connecting position between the grounding mating end 83 and the transition portion 85 is provided with a connecting piece 851 that connects the ground terminals 80 on both sides of the signal terminal pair 710 together. The connecting piece 851 and the two ground terminals 80 connected thereto are integrally stamped and formed. The ground mounting end 84 extends beyond the mounting end 74 of the signal terminal 70. Each of the ground terminals 80 includes a wide side and a narrow side. The wide side of each ground terminal 80 is arranged in a plane perpendicular to the plane where the wide side of the differential signal terminal pair 710 is located. The middle portion 75 of the signal terminal 70 is arranged in a serpentine shape in the widthwise direction of the ground terminal 80, make the physical structure of the two signal terminals of the signal terminal pair 710 equal, and realize the same length of the electrical structure to reduce the deviation of signal transmission to less than 0.20 picoseconds (ps). Each terminal module 50 includes two signal terminal pairs 710, and both sides of each signal terminal pair 710 include a pair of ground terminals 80 connected to each other by a connecting piece 851. The ground terminals 80 are connected to each other through the connecting piece 851 to reduce the crosstalk between adjacent signal terminal pairs 710. The ground terminal 80 is in contact with the absorbing material on the insulating body 60, thereby shielding the signal terminal pair 710 and the adjacent signal terminal pair 710 while absorbing invalid electromagnetic waves during signal transmission. Improve crosstalk and noise during signal transmission. After the first electrical connector 1 and the second electrical connector 2 are mated, the terminal 20 and the corresponding signal terminal 70 are matched with each other to form a signal path. The contact protrusions 333 on the shielding sheet 30 cooperate with the outer side of the corresponding grounding mating end 83 of the ground terminal 80. The signal path composed of the terminal pair 22 and the corresponding signal terminal pair 710 is shielded on the entire path, and has a good effect of shielding electromagnetic crosstalk.

The ground plate 90 is installed on the first side surface 66 of the insulating body 60. The ground plate 90 and the connecting piece 851 are arranged on the same side of the insulating body 60. The connecting piece 851 is located in front of the ground plate 90 along the mating direction. The insulating body 60 is provided with a clamping slot 665, and the ground plate 90 is provided with a clamping piece 95 that matches with the clamping slot 665. The ground plate 90 is mechanically and electrically connected to the ground terminal 80 through assembly or welding. The distance between the ground terminal 80 and the ground plate 90 in the lateral direction is less than 0.2 mm to reduce signal leakage, affect the signal transmission between adjacent signal terminal pairs 710 to prevent EMI.

The plurality of terminal modules 50 include a first terminal module 51 and a second terminal module 52 that cooperates with the first terminal module 51. The first terminal module 51 and the second terminal module 52 are combined with each other through positioning holes and positioning posts. In the lateral direction, the signal terminal pairs 710 in the first terminal module 51 and the second terminal module 52 are arranged in a staggered arrangement at the mounting end 74 and the mating end 73 to improve the anti-interference of signal transmission ability. The upper edge 62 and the lower edge 61 of the insulating body 60 of the first terminal module 51 are respectively provided with first guiding bosses 511. The upper edge 62 and the lower edge 61 of the insulating body 60 of the second terminal module 52 are respectively provided with second guiding bosses 521. The first guiding boss 511 on each upper edge 62 is provided with a first protrusion 513. The second guiding boss 521 of the upper edge 62 is provided with a second protrusion 523. The first guiding boss 511 and the second guiding boss 521 are matched with corresponding guiding grooves 431 on the upper wall 413 and the lower wall 414 of the housing 40, and the first protrusion 513 and the second protrusion 523 are matched with the same hole 433 of the upper wall 413 of the housing 40.

Figure 16:
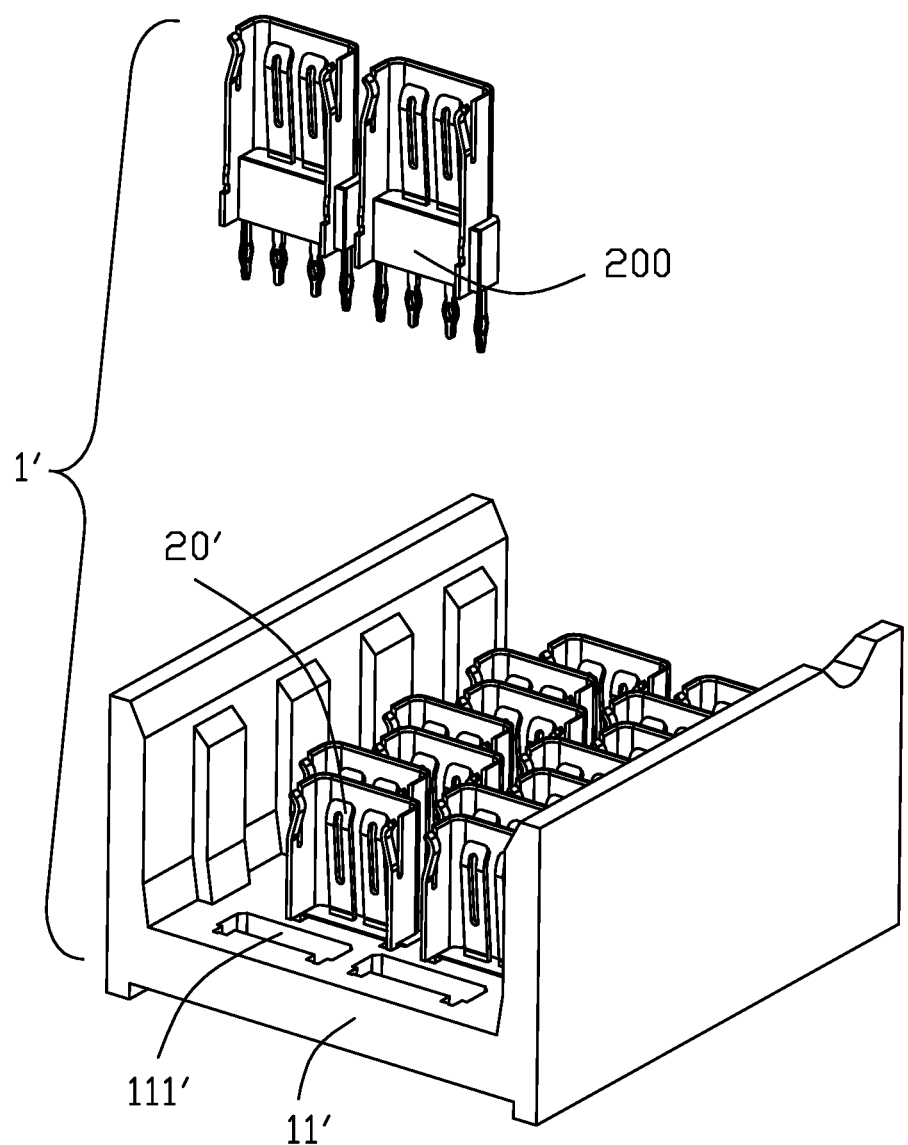
FIG. 16 is a partial exploded view of the second embodiment of the first electrical connector of the connector assembly.
Figure 17:
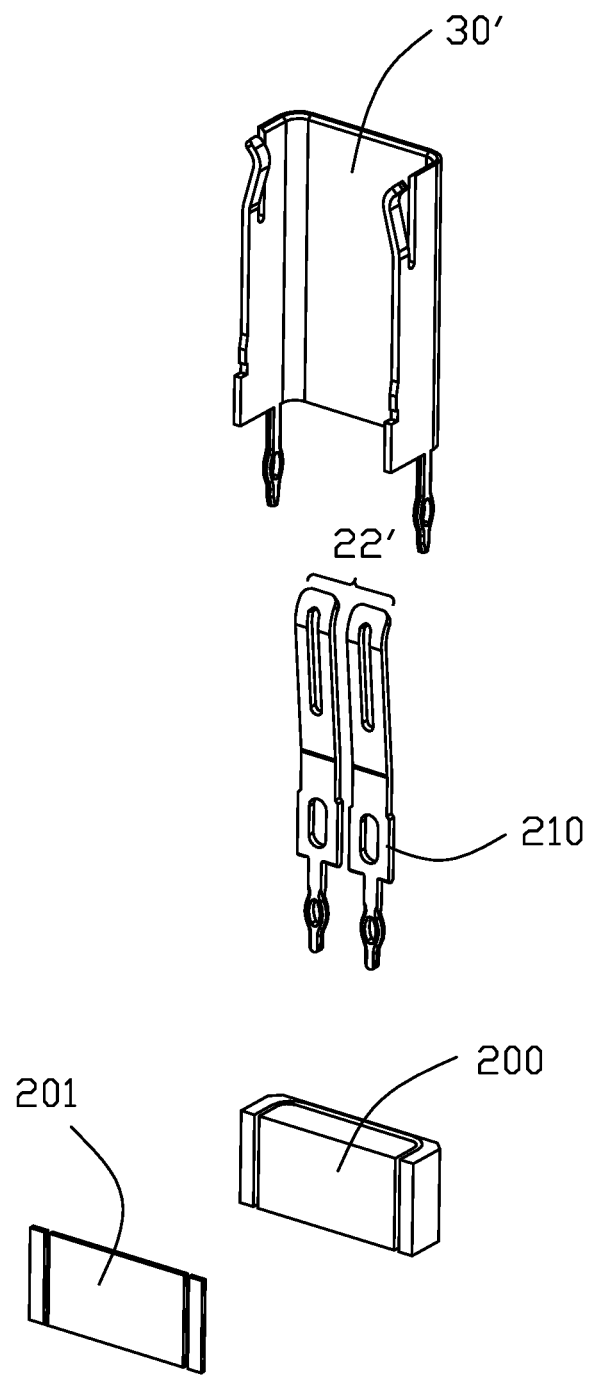
FIG. 17 is further exploded view of part components of the first electrical connector in FIG. 16.

Referring to FIGS. 16-17, another embodiment of the first electrical connector of the present invention is shown. Compared with the first embodiment, the first electrical connector 1' of this embodiment further includes a fixing block 200. The terminal pair 22' and the shielding sheet 30' are integrally formed on the fixing block 200. The outer surface of the fixing block 200 is coated with a wave-absorbing material 201 to absorb invalid electromagnetic waves during signal transmission and improve crosstalk and noise during signal transmission. The mounting hole 111' on the bottom wall 11' cooperates with the fixing block 200 to fix a pair of terminals 20' and a shielding piece 30' for shielding the pair of terminals 20' to the bottom wall 11'. In another embodiment of the present invention (not shown), the terminal pair 22' and the fixing block 200 are integrally formed and then mounted on the bottom wall. The shielding sheet 30' is directly mounted on the bottom wall 11'.

Figure 18:
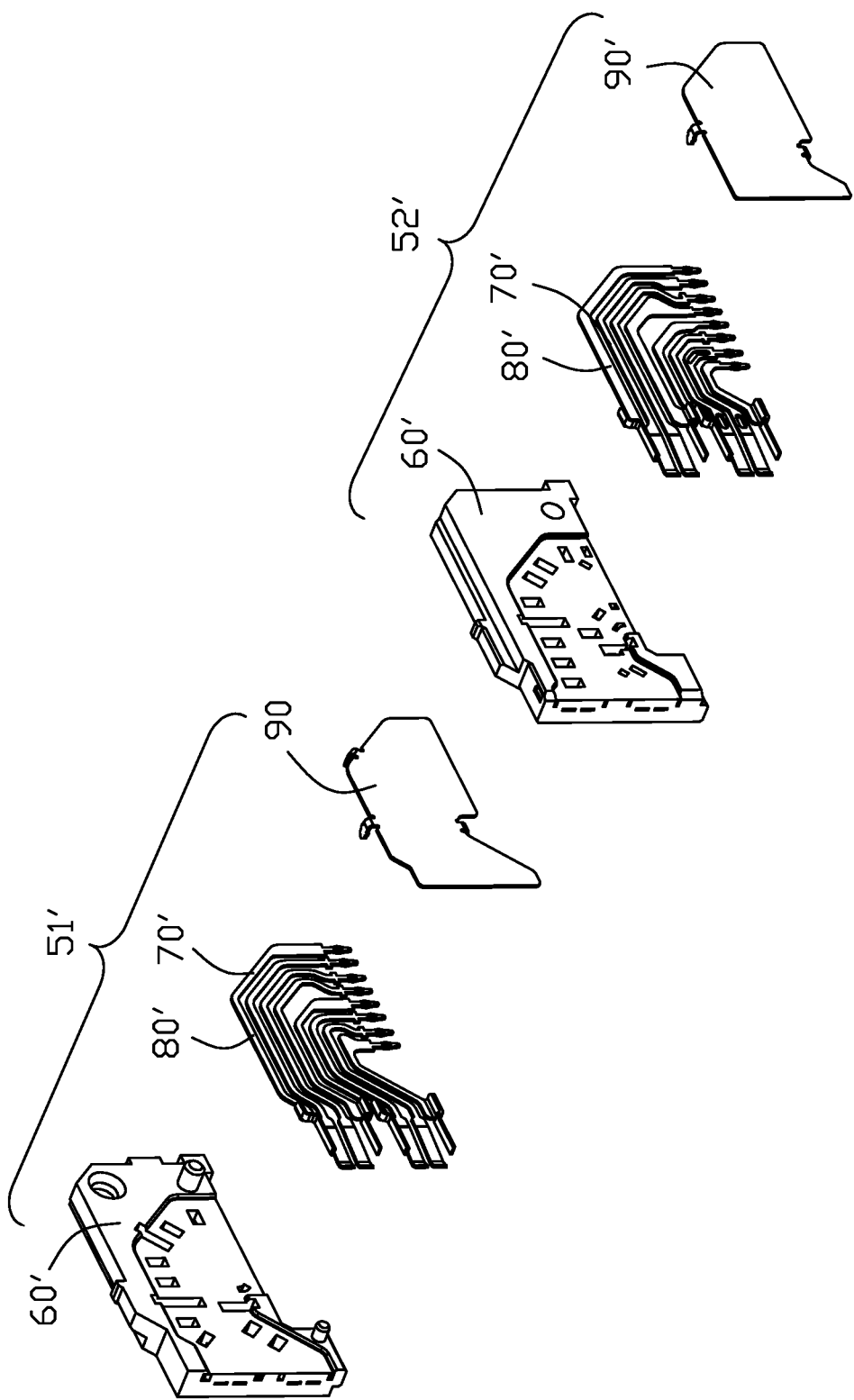
FIG. 18 is an exploded view of the first terminal module and the second terminal module of the second embodiment of the second electrical connector according to the present invention in FIG. 2.
Figure 19:
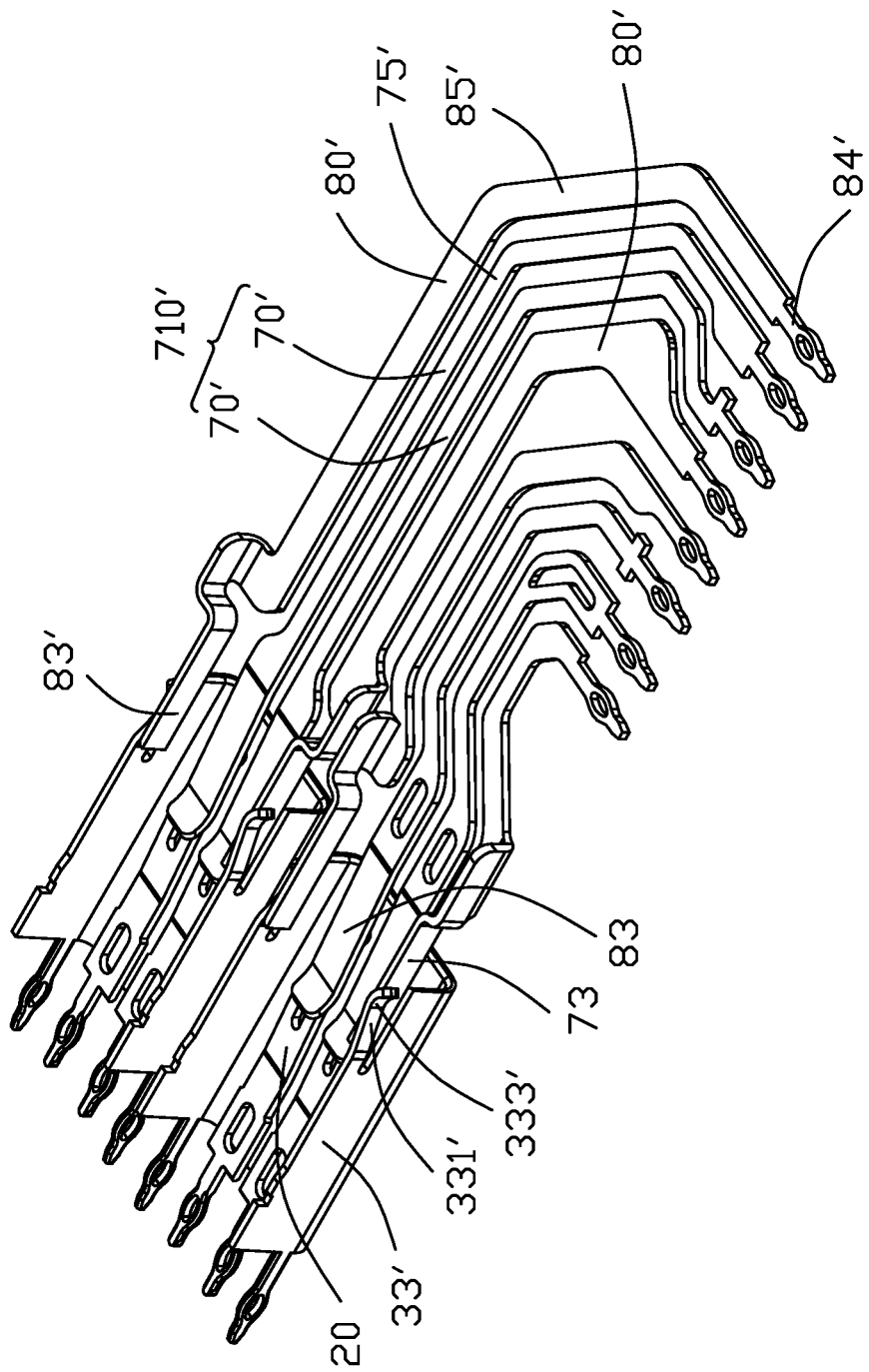
FIG. 19 is a perspective view of the grounding terminal and signal terminal in FIG. 18 mated with the first connector.

FIGS. 18-19 show another embodiment of the second electrical connector 2' of the present invention. Compared with the first embodiment, in this embodiment the signal terminal 70', the ground terminal 80', and the insulating body 60' are integrally formed and the wide sides of the ground terminal 80' are arranged in different planes. Specifically, in one of the terminal modules 50, the intermediate portion 75' of the signal terminal 70' and the transition portion 85' of the ground terminal 80' located on both sides of the signal terminal 70' are narrow-side coupled. The mounting end 74' of the signal terminal 70' and the ground mounting end 84' of the ground terminal 80' are narrow-side coupled. The mating end 73' of the signal terminal 70' and the grounding and grounding mating end 83' of the ground terminal 80' are narrow-side to wide-side coupling.

The above are only some embodiments of the present invention, but not all embodiments. Any equivalent changes to the technical solutions of the present invention by those skilled in the art by reading the description of the present invention are covered by the claims of the present invention.

What is claimed is:

1. An electrical connector comprising:
   an insulating housing; and
   a plurality of terminals held in the insulating housing and arranged in terminal pairs, each of the terminals including:
      a holding portion held in the insulating housing;
      a cantilever extending forward from the holding portion, a slot being provided on the cantilever;
      a contact portion at a front of the cantilever; and
      a mounting portion for mounting on a circuit board; wherein
   the slot extends to the contact portion; and
   in each terminal pair, a first distance from a center of the contact portion of one terminal thereof to a center of the contact portion of the other terminal thereof is less than a second distance from a center of the mounting portion of one terminal thereof to a center of the mounting portion of the other terminal thereof.

2. The electrical connector as claimed in claim 1, wherein a perimeter of the slot is completely contained in the terminal.

3. The electrical connector as claimed in claim 2, wherein each of the terminals includes a wide side and a narrow side, the two terminals forming a terminal pair are narrow-side coupled.

4. The electrical connector as claimed in claim 3, wherein the holding portion includes barbs protruding outward on both sides of the narrow side thereof, and wide barbs protruding outward from the wide side thereof.

5. The electrical connector as claimed in claim 4, wherein the terminal is directly mounted on the insulating housing.

6. The electrical connector as claimed in claim 3, further including a respective fixing block integrally formed with a corresponding terminal pair, an outer surface of the fixing block being coated with a wave-absorbing material.

7. The electrical connector as claimed in claim 6, further including a respective shield for shielding a corresponding terminal pair, and the terminal pair, the shield that shields the terminal pair, and the fixing block are integrally formed.

8. The electrical connector as claimed in claim 3, wherein the insulating housing includes a bottom wall and a pair of side walls together forming a receiving space, the bottom wall is provided with a supporting wall extending to the receiving space for supporting the terminals.

9. An electrical connector comprising a plurality of terminal modules stacked laterally, each of the terminal modules including:
   an insulating body;
   a plurality of ground terminals held in the insulating housing; and
   a plurality of signal terminals held in the insulating body and arranged in pairs, both sides of each signal terminal pair being disposed ground terminals in a longitudinal direction, wherein
   the signal terminals are arranged in a first plane, and the ground terminals are arranged in a second plane different from the first plane, the ground terminals on both sides of the signal terminal pair are mechanically and electrically connected to each other.

10. The electrical connector as claimed in claim 9, wherein the ground terminal includes a grounding mating end for mating with a mating connector, a grounding mounting end mounted on the circuit board, and a transition portion between the grounding mating end and the grounding mounting end, and the transition portion is provided with a connecting piece that connects the ground terminals on both sides of a signal terminal pair together.

11. The electrical connector as claimed in claim 10, wherein the connecting piece and the two ground terminals connected with the connecting piece are integrally stamped.

12. The electrical connector as claimed in claim 11, further comprising a grounding plate arranged on one side of the insulating body, the grounding plate and the connecting piece are arranged on same side of the insulating body, the connecting piece is located in front of the grounding plate along a mating direction, and a lateral distance between the ground plate and the ground terminal is less than 0.2 mm.

13. The electrical connector as claimed in claim 12, wherein the signal terminals and the insulating body are integrally formed, the ground terminals are separately mounted in the insulating body, and a broad side of each ground terminal is arranged in a plane perpendicular to a broad side of the signal terminal.

14. The electrical connector as claimed in claim 13, wherein the signal terminals are arranged in a serpentine shape in a direction of the broad side of the ground terminal to equalize lengths of the two signal terminals constituting the signal terminal pair.

15. The electrical connector as claimed in claim 14, wherein the insulating body includes an air gap for exposing the signal terminal to air, and the outer surface of the insulating body is coated with a layer of absorbing material.

16. An electrical connector comprising a plurality of terminal modules stacked laterally, each of the terminal modules including:
   an insulating body;
   a plurality of ground terminals held in the insulating body, each of the ground terminal including a wide side and a narrow side, each ground terminal including a grounding mating end for mating with a mating connector, a grounding mounting end, and a transition portion between the grounding mounting end and the grounding mating end; and a plurality of signal terminals held in the insulating body and arranged in pairs, ground terminals are provided on both sides of each signal terminal pair in the longitudinal direction, each signal terminal including a wide side and a narrow side, each of the signal terminals including a mating end for mating with the mating connector, a mounting end, and a middle portion between the mounting end and the mating end; wherein the middle portion and the mating ends of the two signal terminals formed the signal terminal pair are narrow-side coupling, the intermediate portion of the signal terminal and the transition portion of the ground terminal shielding it are narrow-side coupling, the mating end of the signal terminal and the grounding mating end of the ground terminal are narrow-side to broad-side coupling.

17. The electrical connector as claimed in claim 16, wherein the mounting end of the signal terminal and the ground mounting end of the ground terminal are narrow-side coupled.

18. The electrical connector as claimed in claim 16, wherein the terminal module includes a first terminal module and a second terminal module spaced apart from the first terminal module, adjacent first terminal module and second terminal module are combined with each other.

19. The electrical connector as claimed in claim 18, further including a housing for installing the plurality of terminal modules, the housing includes a base and an upper and lower walls extending from same side of the base, the lower wall and the upper wall are provided with a plurality of guiding grooves for guiding the terminal modules to be aligned and holes penetrating the upper wall, each terminal module includes a lower edge facing the mounting direction and an upper edge opposite to the lower edge, the upper edge and the lower edge are respectively provided with guiding bosses, and the guiding bosses is provided with protrusions, the guiding bosses of the first terminal module and the second terminal module combined with each other match corresponding guiding grooves on the upper wall and the lower wall, and the protrusions of the first terminal module and the second terminal module combined with each other match the corresponding hole of the upper wall.

\* \* \* \* \*